(12) United States Patent
Mauri et al.

(10) Patent No.: US 11,199,594 B2
(45) Date of Patent: Dec. 14, 2021

(54) TMR SENSOR WITH MAGNETIC TUNNEL JUNCTIONS WITH A FREE LAYER HAVING AN INTRINSIC ANISOTROPY

(71) Applicant: Western Digital Technologies, Inc., San Jose, CA (US)

(72) Inventors: Daniele Mauri, San Jose, CA (US); Alexander M. Zeltser, San Jose, CA (US); Goncalo Baiao De Albuquerque, San Jose, CA (US); Yuankai Zheng, Fremont, CA (US); Christian Kaiser, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 99 days.

(21) Appl. No.: 16/728,514

(22) Filed: Dec. 27, 2019

(65) Prior Publication Data
US 2021/0063500 A1   Mar. 4, 2021

Related U.S. Application Data

(60) Provisional application No. 62/892,235, filed on Aug. 27, 2019.

(51) Int. Cl.
| | | |
|---|---|---|
| G01R 33/09 | (2006.01) | |
| G11B 5/39 | (2006.01) | |
| B82Y 25/00 | (2011.01) | |

(52) U.S. Cl.
CPC .......... *G01R 33/096* (2013.01); *B82Y 25/00* (2013.01); *G01R 33/093* (2013.01); *G01R 33/098* (2013.01); *G11B 5/3909* (2013.01); *G11B 5/3932* (2013.01); *G11B 5/3945* (2013.01)

(58) Field of Classification Search
None
See application file for complete search history.

(56) References Cited

U.S. PATENT DOCUMENTS

| | | | |
|---|---|---|---|
| 5,936,293 A | 8/1999 | Parkin | |
| 6,114,719 A * | 9/2000 | Dill | ...................... G11C 11/1675 257/295 |
| 6,818,961 B1 | 11/2004 | Rizzo et al. | |

(Continued)

OTHER PUBLICATIONS

Paulo P. Freitas et al.; "Spintronic Sensors" Proceedings of the IEEE; vol. 104, No. 10, pp. 1984-1918; Oct. 2016.

(Continued)

*Primary Examiner* — Jefferson A Evans
(74) *Attorney, Agent, or Firm* — Patterson & Sheridan, LLP; Steven H. Versteeg (57) ABSTRACT

Embodiments of the present disclosure generally relate to a large field range TMR sensor of magnetic tunnel junctions (MTJs) with a free layer having an intrinsic anisotropy. In one embodiment, a tunnel magnetoresistive (TMR) based magnetic sensor in a Wheatstone configuration includes at least one MTJ. The MTJ includes a free layer having an intrinsic anisotropy produced by deposition at a high oblique angle from normal. Magnetic domain formations within the free layer can be further controlled by a pinned layer canted at an angle to the intrinsic anisotropy of the free layer, by a hard bias element, by shape anisotropy, or combinations thereof.

20 Claims, 10 Drawing Sheets

(56) References Cited

U.S. PATENT DOCUMENTS

| | | | |
|---|---|---|---|
| 8,294,577 B2* | 10/2012 | Deak | G11C 11/161 340/568.1 |
| 8,336,194 B2 | 12/2012 | Yuan et al. | |
| 8,490,279 B2 | 7/2013 | Zhou et al. | |
| 8,963,264 B2 | 2/2015 | Dimitrov et al. | |
| 9,240,200 B2 | 1/2016 | Covington et al. | |
| 9,349,391 B2 | 5/2016 | Freitag et al. | |
| 9,389,286 B2 | 7/2016 | Yamazaki et al. | |
| 9,591,221 B2 | 3/2017 | Miller et al. | |
| 9,640,753 B2 | 5/2017 | Sun et al. | |
| 9,684,184 B2 | 6/2017 | Miller et al. | |
| 9,927,431 B2* | 3/2018 | Wang | G01N 33/54326 |
| 2002/0126425 A1 | 9/2002 | Balamane et al. | |
| 2008/0137237 A1 | 6/2008 | Freitag et al. | |
| 2009/0243607 A1* | 10/2009 | Mather | B82Y 25/00 324/249 |
| 2010/0276272 A1 | 11/2010 | Zheng et al. | |
| 2011/0007431 A1* | 1/2011 | Braganca | G01R 33/098 360/324.12 |
| 2012/0015099 A1 | 1/2012 | Sun et al. | |
| 2012/0326713 A1* | 12/2012 | Zimmer | G01R 33/09 324/252 |
| 2015/0082886 A1* | 3/2015 | Fukuzawa | G01P 15/105 73/514.31 |
| 2015/0185297 A1* | 7/2015 | Zimmer | G01R 33/095 324/252 |
| 2016/0320459 A1 | 11/2016 | Mather et al. | |
| 2018/0356473 A1* | 12/2018 | Hirota | G01R 33/096 |
| 2019/0020822 A1 | 1/2019 | Sharma et al. | |
| 2020/0217907 A1* | 7/2020 | Raberg | H01F 10/3254 |

OTHER PUBLICATIONS

Zhengqi Lu et al.; "Doubly Exchange-Biased FeMn/NiFe/Cu/NiFe/CrMnPt Spin Valves" IEEE Transactions on Magnetics, vol. 36, No. 5, pp. 2899-2901; Sep. 2000.

Lisa Jogschies, et al.; "Review Developments of Magneto resistive Sensors for Industrial Applications" Sensors, http://sci-hub.tw/https://www.mdpi.com/1424-8220/15/11/28665/pdf; Nov. 12, 2015, p. 28665-28689.

International Search Report and Written Opinion issued in corresponding International Patent Application No. PCT/US2020/024079, dated Jul. 15, 2020 (10 pages).

* cited by examiner

TMR SENSOR WITH MAGNETIC TUNNEL JUNCTIONS WITH A FREE LAYER HAVING AN INTRINSIC ANISOTROPY

CROSS-REFERENCE TO RELATED APPLICATIONS

This application claims benefit of U.S. provisional patent application Ser. No. 62/892,235, filed Aug. 27, 2019, which is hereby incorporated by reference.

BACKGROUND OF THE DISCLOSURE

Field of the Disclosure

Embodiments of the present disclosure generally relate to a large field range TMR sensor of magnetic tunnel junctions (MTJs) with a free layer having intrinsic anisotropy.

Description of the Related Art

Hall effect magnetic sensors are inexpensive, have large operating field range, have good linearity, but have low sensitivity. Magnetoresistive (MR) sensors, on the other hand, have much larger sensitivity (>100×) but are typically designed for low field applications less than 80 Oe. For some applications, there is a need for high sensitivity sensors with a working range above 80 Oe. For instance, the application may be suited for detection of fields in the plane of the sensor (as is the case for MR sensors) rather than fields perpendicular to the sensor plane (as is typical for Hall sensors).

U.S. Pat. No. 9,349,391 B2 to Freitag et al. assigned to Western Digital Technologies, Inc. is directed to forming a magnetic head with a magnetic layer deposited by oblique angle deposition to control the anisotropy of the magnetic layer. Freitag et al. discloses a free layer formed by oblique angle deposition with intrinsic anisotropy decreasing with increasing thickness of the free layer. However, there is a need for a free layer with large intrinsic anisotropy at a large thickness of the free layer.

SUMMARY OF THE DISCLOSURE

Embodiments of the present disclosure generally relate to a large field range TMR sensor of magnetic tunnel junctions (MTJs) with a free layer having an intrinsic anisotropy.

In one embodiment, a tunnel magnetoresistive (TMR) based magnetic sensor in a Wheatstone configuration includes at least one MTJ. The MTJ includes a free layer having an intrinsic anisotropy produced by deposition at a high oblique angle from normal.

In another embodiment, a TMR based magnetic sensor in a Wheatstone configuration includes at least one MTJ. The MTJ includes a free layer having an intrinsic anisotropy produced by deposition at a high oblique angle from normal. The MTJ includes a pinned layer having a magnetization direction orthogonal to the intrinsic anisotropy of the free layer. The MTJ has a hard bias element positioned proximate the free layer.

In still another embodiment, a TMR based magnetic sensor in a Wheatstone configuration includes at least one MTJ. The MTJ includes a pinned layer. A barrier layer is over the pinned layer. A free layer is over the barrier layer. The free layer has an intrinsic anisotropy from about 200 Oe to about 1600 Oe.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to a large field range TMR sensor of magnetic tunnel junctions (MTJs) with a free layer having intrinsic anisotropy. The free layer of the MTJ is formed to have intrinsic anisotropy by oblique angle deposition. The free layer can have high intrinsic anisotropy of about 80 Oe or above. Magnetic domain formations within the free layer can be further controlled by a pinned layer canted at an angle to the intrinsic anisotropy of the free layer, by a hard bias element, by shape anisotropy, or combinations thereof. MTJs with a free layer having high intrinsic anisotropy can form TMR sensors in a Wheatstone configuration having high sensitivity, low hysteresis, and good linearity in response to sensed magnetic fields.

Figure 1:
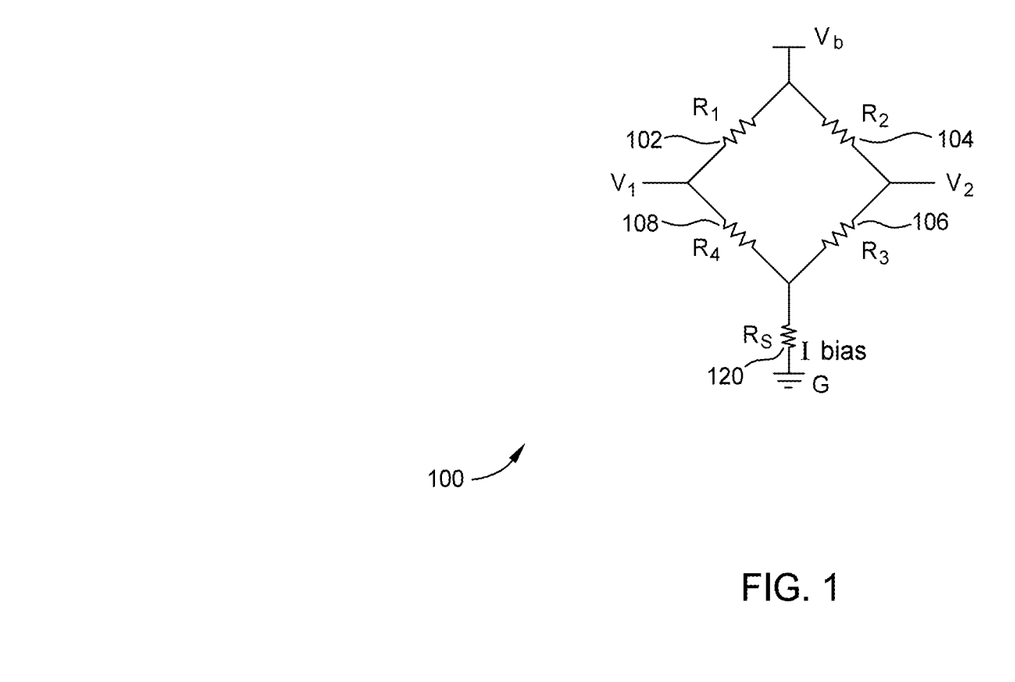
FIG. 1 is a circuit diagram illustrating certain embodiments of a tunnel magnetoresistive based magnetic sensor in a Wheatstone configuration.

FIG. 1 is a circuit diagram illustrating certain embodiments of a TMR based magnetic sensor 100 in a Wheatstone configuration. The TMR based magnetic sensor 100 can include four variable resistor legs of a first magnetoresistance leg 102, a second magnetoresistance leg 104, a third magnetoresistance leg 106, and a fourth magnetoresistance leg 108 arranged in a Wheatstone configuration. Terminal Vb and terminal G are used to provide a bias voltage/current from Vb to G. Terminals V1 and V2 are used to measure signals of the voltage difference between V1 and V2 representing a sensed magnetic field. Terminals V1 and V2 may be coupled to an optional amplifier to amplify the signal. The TMR based magnetic sensor 100 may optionally include a series resistor 120 which can be used to adjust the DC level of V1 and V2.

Neighboring magnetoresistance legs are formed to opposite polarity. For example, the first magnetoresistance leg 102 and the third magnetoresistance leg 106 can have a positive response to a sensed magnetic field and the second magnetoresistance leg 104 and the fourth magnetoresistance leg 108 can have a negative response to the sensed magnetic field. In another example, the first magnetoresistance leg 102 and the third magnetoresistance leg 106 can have a negative response to a sensed magnetic field and the second magnetoresistance leg 104 and the fourth magnetoresistance leg 108 can have a positive response to the sensed magnetic field.

The TMR based magnetic sensor 100 in a Wheatstone configuration provides double the signal based upon the same sensing bias current in comparison to a sensor with a single magnetoresistance leg. The TMR based magnetic sensor 100 in a Wheatstone configuration has reduced impact to thermal drifts in comparison to a sensor with a single magnetoresistance leg. Although the TMR based magnetic sensor 100 of FIG. 1 is shown in a full Wheatstone configuration with four variable resistor legs, in other embodiments the TMR based magnetic sensor can comprise a quarter Wheatstone bridge configuration with one variable resistor leg and three fixed resistor legs or a half Wheatstone bridge configuration with two variable resistor legs and two fixed resistor legs.

Figure 2:
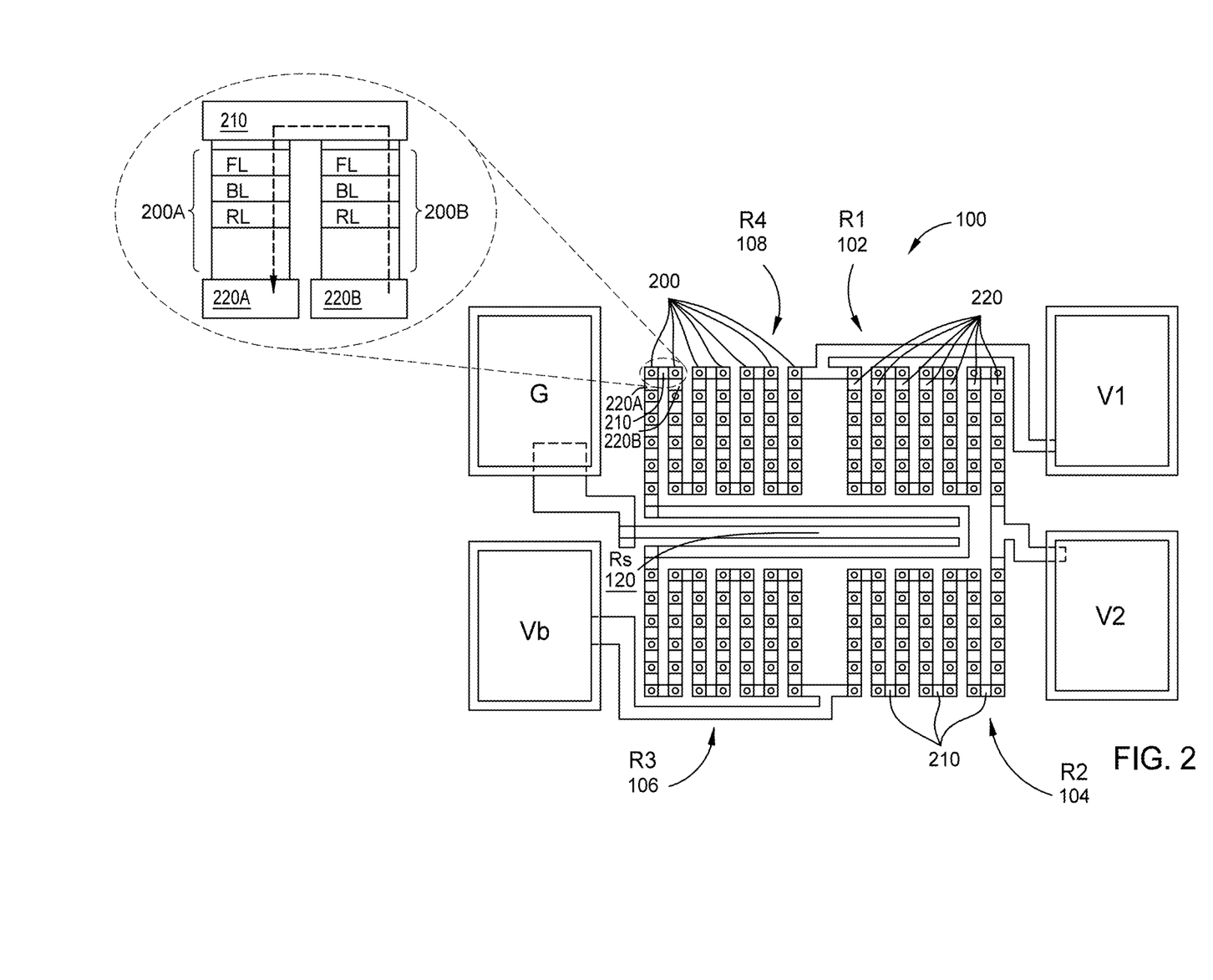
FIG. 2 is a schematic plan view of a layout illustrating certain embodiments of a TMR based magnetic sensor in a Wheatstone configuration of FIG. 1.

FIG. 2 is a schematic plan view of a layout illustrating certain embodiments of the TMR based magnetic sensor 100 in a Wheatstone configuration of FIG. 1. For ease of description, FIG. 2 includes like numerals as used in FIG. 1. As shown in FIG. 2, each of the four magnetoresistance legs 102, 104, 106, 108 comprises a string of MTJs 200 coupled in series. The MTJs 200 in a magnetoresistance leg are coupled together by a plurality of top electrodes 210 and a plurality of bottom electrodes 220. In certain embodiments, each magnetoresistance leg 102, 104, 106, 108 individually comprises from 10 to 100 MTJs, such as from 20 to 50 MTJs. In certain embodiments, the TMR based sensor 100 can be made to occupy a surface area from about 0.1 mm$^2$ to about 50 mm$^2$.

In one aspect, MTJs 200 connected in series reduce the overall noise of the sensed magnetic field for the same signal level in comparison to a leg composed of a single MTJ. For example, the insert shows an enlarged cross-sectional view of certain embodiments of two MTJs 200A, 200B formed after patterning. The two MTJs 200A, 200B are coupled in series sharing the same top electrode 210 with different bottom electrodes 220A, 220B with an electron current flow as shown in the dotted lined.

Noise in the MTJ may arise from electrical sources, like charge trapping in the MTJ barrier, or magnetic sources such as thermally activated local magnetization angle changes. Since the noise in each MTJ is essentially uncorrelated, the series connection of MTJs 200 reduces the overall noise. In another aspect, MTJs 200 connected in series reduce the voltage drop across each individual MTJ 200 improving reliability of the TMR based magnetic sensor in comparison to a leg composed of a single MTJ. For example, a barrier layer of a MTJ has a certain lifetime based upon the total voltage across the MTJ. By spreading the voltage drop across a plurality of MTJs 200, the voltage drop across a single MTJ from the plurality of MTJs 200 is reduced. The reduced voltage drop across each MTJ increases the lifetime and reliability of each MTJ 200 and thus increases the lifetime and reliability of the sensor 100 as well.

Other layouts of a TMR based sensor are possible, such as other layouts of MTJs in series and/or in parallel, other layouts of the electrodes, and other layouts of the terminals.

Figure 3:
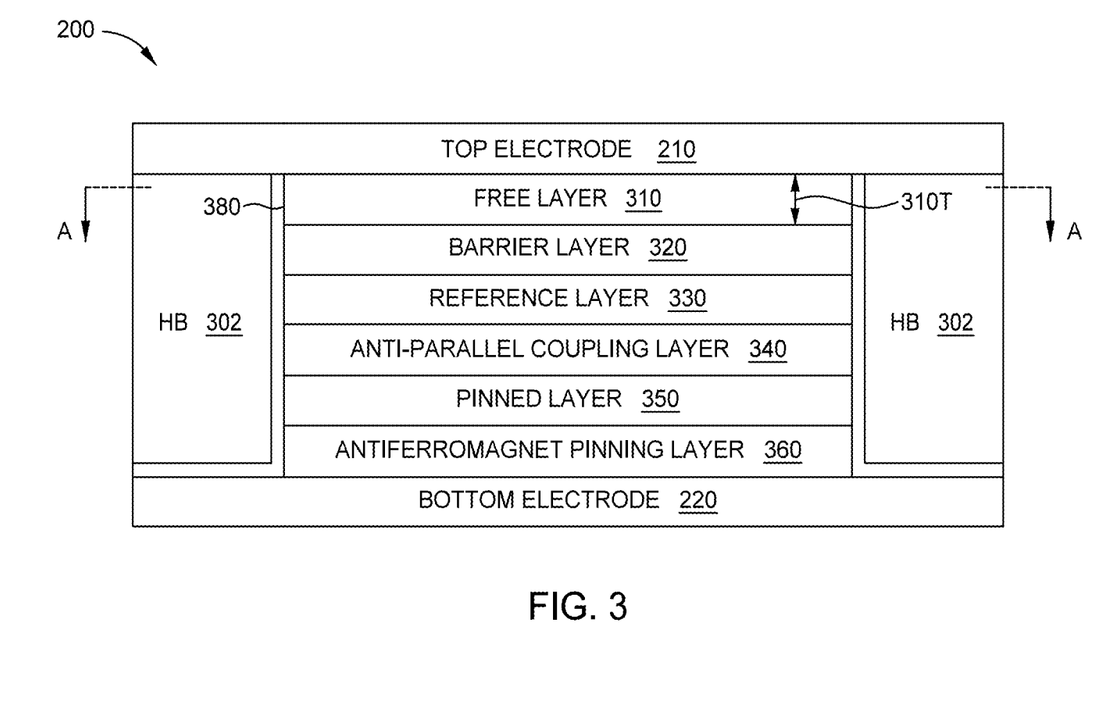
FIG. 3 is a schematic side view illustrating certain embodiments of a single MTJ.

FIG. 3 is a schematic side view illustrating certain embodiments of a single MTJ 200, such as one of the MTJs 200 of FIG. 2. The single MTJ 200 can be used in the plurality of MTJs connected in series forming the magnetoresistance legs of TMR based magnetic sensor 100 of FIG. 2 or other suitable TMR based magnetic sensors. For ease of description, FIG. 3 includes like numerals as used in FIG. 2. The MTJ 200 comprises a free layer 310, a barrier layer 320, a reference layer 330, an antiparallel (AP) coupling layer 340, a pinned layer 350, and an antiferromagnetic (AFM) pinning layer 360. The MTJ 200 is bottomed pinned with the AFM pinning layer 360 proximate the bottom electrode 220 and the free layer proximate a top electrode 210.

As shown in FIG. 3, the pinned layer 350, the AP coupling layer 340, and the reference layer 330 form a synthetic antiferromagnetic (SAF) pinned structure. In other embodiments, the MTJ 200 may comprise a simple pinned structure or may comprise two or more SAF pinned structures. The MTJ 200 may include other layers, such as seed layer(s) (not shown), capping layer(s) (not shown), contact layers, and other pinning structures.

The free layer 310 is formed to have intrinsic anisotropy by oblique angle deposition. The free layer 310 can comprise single or multiple layers of CoFe, NiFe, other ferromagnetic materials, and combinations thereof. The reference layer 330 can comprise single or multiple layers of CoFe, other ferromagnetic materials, and combinations thereof. The antiparallel (AP) coupling layer 340 can comprise single or multiple layers of Ru, Ru alloys other non-magnetic materials, and combinations thereof. The pinned layer 350 can comprise single or multiple layers of CoFe, CoB, CoFeB, other ferromagnetic materials, and combinations thereof. The antiferromagnetic (AFM) pinning layer 360 can comprise single or multiple layers of PtMn, NiMn, IrMn, IrMnCr, other antiferromagnetic materials, and combinations thereof.

The AFM pinning layer 360 has a fixed magnetization that in turn substantially fixes the magnetic moment of the pinned layer 350. The reference layer 330 is antiparallel coupled with the pinned layer 350 across the antiparallel coupling layer 340. Accordingly, the magnetization of the reference layer 330 is oriented in a second direction that is antiparallel to the direction of the magnetization of the pinned layer 350. In certain embodiments, the reference layer 330 is formed to be about 90° to the free layer 310.

The free layer 310 of the MTJ 200 rotates from its easy axis to its hard axis in the presence of a sensed magnetic field. The rotation of the free layer 310 relatively to the reference layer 330 changes the resistance of the MTJ 200. For example, the resistance of the MTJ 200 with the free layer 310 and the reference layer 330 in an anti-parallel state can be three times higher than the free layer 310 and the reference layer 330 in a parallel state. In certain operating magnetic field ranges, magnetization of the free layer 310 can rotate while the magnetization directions of the reference layer 330 and the pinned layer 350 are substantially unrotated by external magnetic fields.

Figure 4:
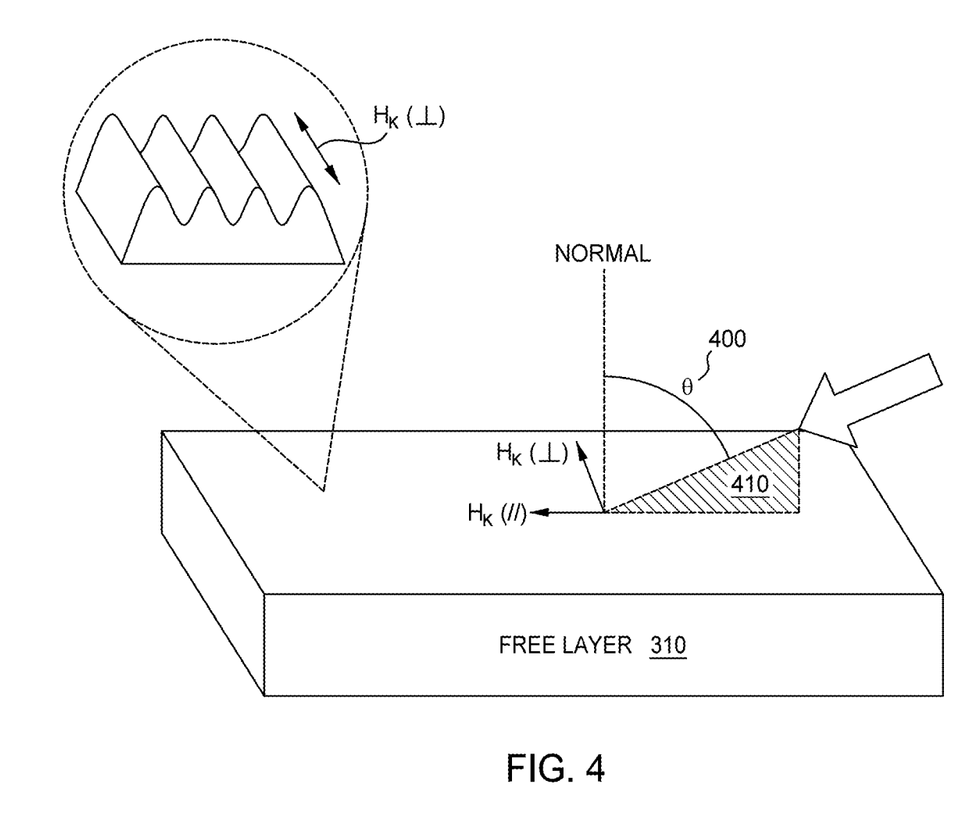
FIG. 4 is a schematic illustration of certain embodiments of forming a free layer with intrinsic anisotropy by oblique angle deposition.

FIG. 4 is a schematic illustration of certain embodiments of forming a free layer 310 with intrinsic anisotropy by oblique angle deposition. Deposition of the free layer 310 at an oblique angle 400 induces intrinsic anisotropy of deposited material. The term "intrinsic anisotropy" (abbreviated "$H_K$" herein) refers to in plane anisotropy that is present in unpatterned films. After patterning the film, additional shape anisotropy may or may not be present depending on the shape of the patterned film.

In certain embodiments, the oblique angle 400 of deposition of the free layer 310 over the barrier layer 320 is at a high oblique angle 400 from about 55° to about 85° from normal, such as from about 60° to about 80° from normal. In certain embodiments, deposition at a high oblique angle 400 produces high intrinsic anisotropy of about 80 Oe or above, such as about 300 Oe or above, such as about 600 Oe or above, or such as about 900 Oe or above. For example, in certain embodiments, the free layer has intrinsic anisotropy from about 80 Oe to about 1600 Oe. In certain embodiments, deposition at a high oblique angle 400 produces high intrinsic anisotropy substantially oriented perpendicular to a plane 410 of incidence of deposition. Deposition at a high angle form deposited material with micro ridges or micro roughness. The micro ridges are substantially oriented perpendicular to the plane 410 of incidence. Deposition at a low angle from about 0° to about 45° from normal undesirably produces low intrinsic anisotropy, such as about 20 Oe or less, in plane intrinsic anisotropy, substantially oriented along the direction of magnetization during film growth. An intrinsic anisotropy of 20 Oe or less is insufficient for MTJs in large field Wheatstone sensor applications.

Deposition at an oblique angle can be conducted by physical vapor deposition (PVD), such as by sputtering, evaporation, and ion beam sputtering. PVD tools capable of deposition at an oblique angle include controlled incidence sputtering (CIS) PVD tools from Canon Anelva Corporation of Kawasaki, Japan and include linear scan (LS) PVD tools from Veeco Instruments Inc. of Plainview, N.Y. Other directional deposition technologies may also be utilized.

The other layers of the MTJs 200 (FIG. 3), such as the barrier layer 320, the pinned layer 350, and the AFM pinning layer 360, can be deposited under standard conditions, such as at a deposition at or a near normal angle and with a rotating wafer substrate. A deposition at or a near normal angle with a rotating wafer substrate provides a high quality and smooth layers. Deposition of the free layer 310 at a high angle 400 from normal causes the free layer 310 to have a high surface roughness. As a consequence, the MTJ 200 is bottom pinned with the AFM pinning layer 360 proximate the bottom electrode 220. The top electrode 210 can be deposited over a high surface roughness of the free layer 310 without significantly impacting the performance of the MTJ 200.

Figure 5A:
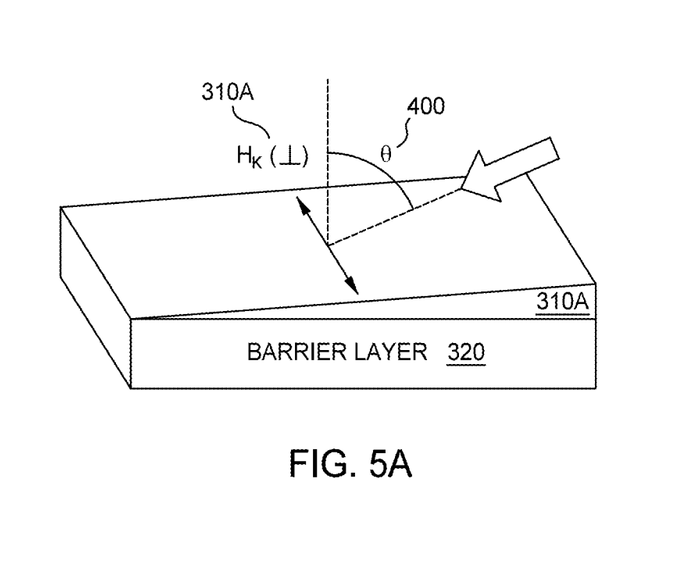
FIGS. 5A-5B are schematic illustrations of certain embodiments of method of depositing multiple sub-layers to form a film with intrinsic anisotropy.
Figure 5B:
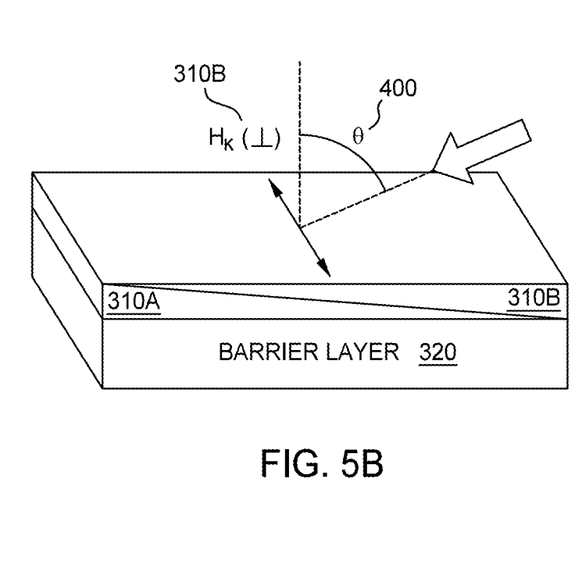

FIGS. 5A-5B are schematic illustrations of certain embodiments of a method of depositing multiple sub-layers to form a film with intrinsic anisotropy by oblique angle deposition. As shown in FIG. 5A, a first sub-layer 310A is deposited, such as by PVD, at a high oblique angle 400 from normal over a barrier layer 320. The wafer substrate is static (i.e., not rotated) during deposition in a first position. The first sub-layer 310A of the free layer 310 at the edge of the wafer substrate proximate to the deposition source may form to a greater thickness. As shown in FIG. 5B, the wafer substrate is rotated by any angle, such as about 180° from the first position in FIG. 5A to a second position. Then, a second sub-layer 310B is deposited, such as by PVD, at a high oblique angle 400 from normal over the first sub-layer 310A of the free layer 310. The wafer substrate is static during deposition. By forming a free layer 310 by depositing two or more sub-layers 310A, 310B at a high oblique angle 400 from normal with static physical vapor deposition of the wafer substrate at different rotational position, the overall thickness uniformity of the free layer 310 may be increased. Each of the sub-layers 310A, 310B may be the same or may be different materials, in which at least one of the sub-layers comprises a ferromagnetic material. Each of the sub-layers 310A, 310B may be the same or different oblique angles 400.

In certain embodiments, each of the sub-layers 310A, 310B comprises the same or different ferromagnetic material deposited over a wafer substrate at the same or different high oblique angle 400 from normal. Deposition at a high oblique angle(s) 400 from normal occurs while the wafer substrate is static during deposition. Between depositions, the wafer substrate is rotated by about 180°, so that the high intrinsic anisotropy of the sub-layer 310A and the high intrinsic anisotropy of the sub-layer 310B are both substantially aligned in the same direction.

In reference to FIG. 3, the free layer 310 has a thickness 310T chosen to optimize the TMR coefficient and the anisotropy. The MTJ 200 and thus a TMR based magnetic sensor comprising a plurality of the MTJs 200 can operate over large field ranges, such as in the hundreds Oe range to a few thousands Oe range. Prior art MTJs typically operate over small field ranges, such as ±80 Oe. In certain embodiments, a TMR based magnetic sensor comprising a plurality of the MTJs 200 in a Wheatstone configuration can operate over large external magnetic field ranges, such over a magnetic field range of ±150 Oe, such as ±600 Oe, such as ±1,000 Oe, or such as ±3,000 Oe. In certain embodiments, a TMR based magnetic sensor comprising a plurality of the MTJs 200 in a Wheatstone configuration can operate over large external magnetic field ranges added to a constant DC field, such over a magnetic field range of ±150 Oe superimposed over a constant DC field, such as ±600 Oe superimposed over a constant DC field, such as ±1,000 Oe superimposed over a constant DC field, or such as ±3,000 Oe superimposed over a constant DC field.

Magnetic domains may form in a free layer with high intrinsic anisotropy after approaching hard axis saturation. When external field is reduced from saturation, the magnetization of the free layer will seek to rotate to the nearest easy axis. The nearest easy axis may vary from location to location across the MTJ due to local demagnetizing fields or angular dispersion of the easy axis. The magnetization in a multi-domain state leads to hysteretic and non-linear behavior.

Figure 6:
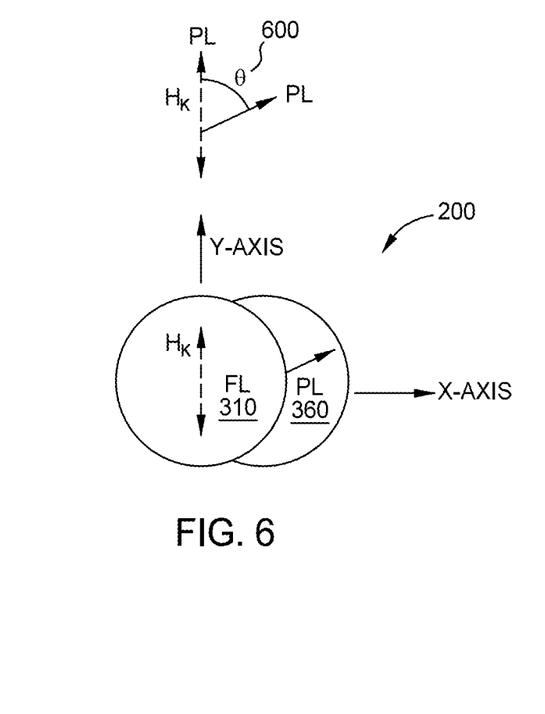
FIG. 6 is a schematic top view illustrating certain embodiments of a single MTJ in which a magnetization direction of a pinned layer is canted at an angle to an intrinsic anisotropy of a free layer.

FIG. 6 is a schematic top view illustrating certain embodiments of a single MTJ, such as a MTJ 200 along plane A-A of FIG. 3, in which the magnetization direction of the pinned layer 350 is canted at an angle 600 to the intrinsic anisotropy of the free layer 310. For ease of description, FIG. 6 includes like numerals as used in FIG. 3. Intrinsic anisotropy can be provided by deposition of the free layer 310 at a high oblique angle. Canting the pinned layer 350 to the intrinsic anisotropy of the free layer 310 helps to control the magnetic domains of the free layer for a low hysteresis or hysteresis-free response. With the intrinsic anisotropy of the free layer 310 oriented in the z-axis, the MTJ can detect fields in the x-axis direction.

The canted pinned layer 350 exerts a small bias field to the free layer 310 which helps the magnetization return coherently to the easy axis after saturation. In certain embodiments, the pinned layer 350 is canted at an angle 600 from about 40° to about 50° from the intrinsic anisotropy of the free layer 310. In certain embodiments, a canted pinned layer produces a stray field from about 10 Oe to about 30 Oe on the free layer 310. As shown in FIG. 6, in certain embodiments the MTJ 200 does not have any hard bias elements.

Referring to FIG. 3, in certain embodiments, the MTJ 200 has hard bias (HB) element 302 to provide a low hysteresis response or a hysteresis-free response alternatively or in addition to having a pinned layer canted an angle. The HB element 302 exerts a bias field to the free layer 310 which helps the magnetization return coherently to the easy axis after saturation. The bias field of the HB element 302 can be adjusted by the thickness 302T of the HB element and/or it separation from the free layer 310. In certain embodiments, the HB element 302 produces a bias field of about 20 Oe or more on the free layer, such as about 30 Oe or more on the free layer. The angle of the magnetization of the HB element 302 can be set by the magnetic initialization in a large field.

The HB element 302 comprises a single layer or multiple layers of cobalt, a cobalt alloy (such as CoPt or CoPtCr), other hard magnetic materials, or combinations thereof. In certain embodiments, the MTJ 200 further has an insulation layer 380 formed between the HB element 302 and the free layer 310. The insulation layer 380 comprises aluminum oxide, magnesium oxide, and other non-electrically conducting materials. The insulation layer 380 prevents or reduces electrical shunting of the bias current through the HB elements 302, 304 rather than through the barrier layer 320.

Figure 7A:
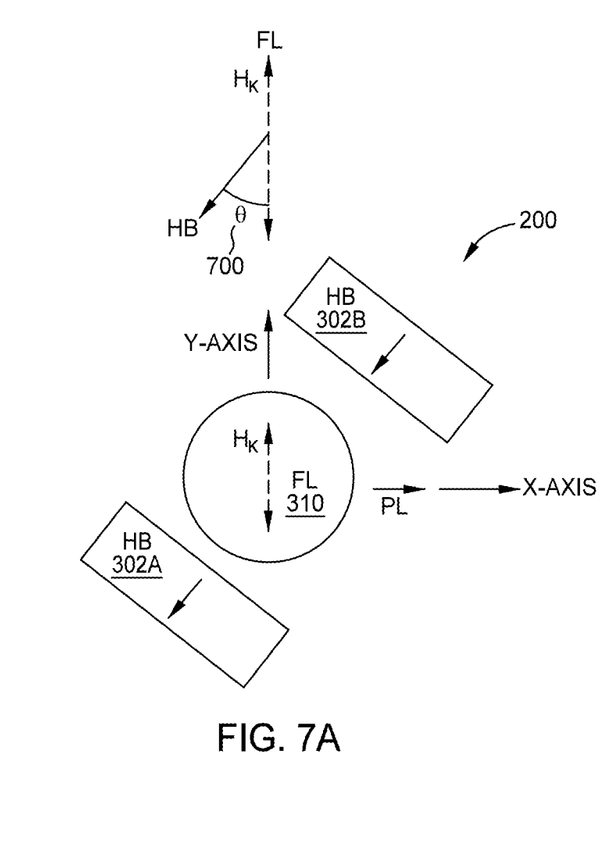
FIG. 7A is a schematic top view illustrating certain embodiments of a shingle MTJ having intrinsic anisotropy and having a hard bias (HB) element comprising a first HB sub-element and a second HB sub-element.

FIG. 7A is a schematic top view illustrating certain embodiments of a single MTJ, such as a MTJ 200 along plane A-A of FIG. 3, having intrinsic anisotropy and having a HB element 302 comprising a first HB sub-element 302A and a second HB sub-element 302B. For ease of description, FIG. 7A includes like numerals as used in FIG. 3. Intrinsic anisotropy can be provided by deposition of the free layer 310 at a high oblique angle. The magnetization direction of the first HB sub-element 302A and the second HB sub-element 302B can be set at an angle 700 from the intrinsic anisotropy of the free layer 310. The pinned layer 350 can be set orthogonal to the intrinsic anisotropy of the free layer 310 in order to increase the operating range of the sensed magnetic field. With the intrinsic anisotropy of the free layer 310 oriented in the y-axis, the MTJ can detect fields in the x-axis direction.

Figure 7B:
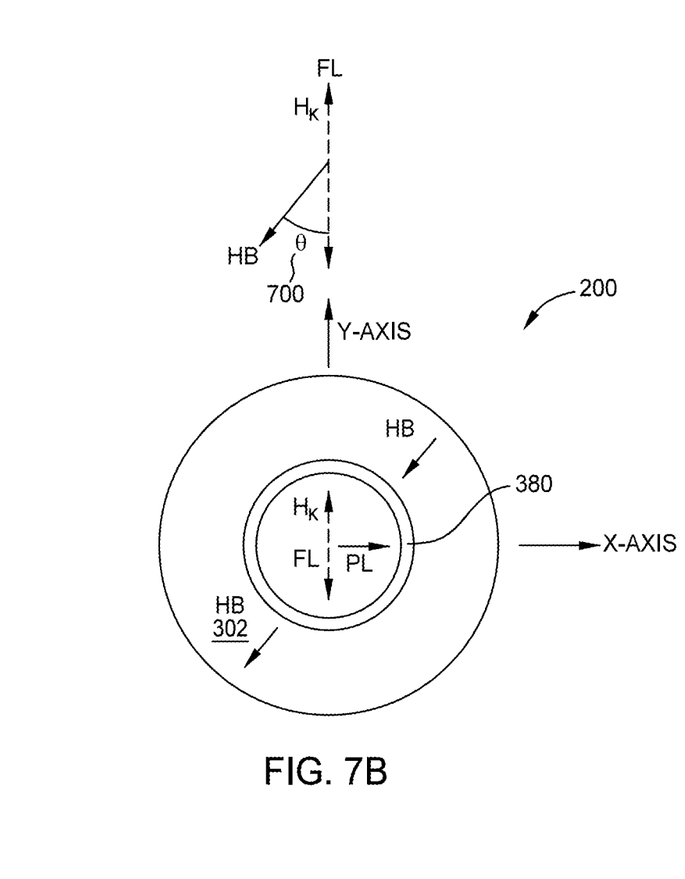
FIG. 7B is a schematic top view illustrating certain embodiments of a single MTJ having intrinsic anisotropy and having a hard bias (HB) element is formed concentrically around a free layer.

FIG. 7B is a schematic top view illustrating certain embodiments of a single MTJ, such as a MTJ 200 of FIG. 3, having intrinsic anisotropy and having a HB element 302 formed in a self-aligned process around the free layer 310. For ease of description, FIG. 7B includes like numerals as used in FIG. 3. Intrinsic anisotropy can be provided by deposition of the free layer 310 at a high oblique angle. The HB element 302 can be formed in a self-aligned process utilizing the same mask (i.e., a hard mask, a photoresist, and combinations thereof) used to define the MTJ shape. For example, a mask can define a circular MTJ 200 by ion milling. An Insulation layer 380 can be deposited over the area removed by ion milling utilizing the same mask defining the MTJ 200. An HB element 302 can be deposited over the insulation layer 380 utilizing the same mask defining the MTJ 200. The magnetization direction of the HB element 302 can be set at an angle 700 from the intrinsic anisotropy of the free layer 310. The pinned layer 350 can be set orthogonal to the intrinsic anisotropy of the free layer 310 in order to increase the operating range of the sensed magnetic field. With the intrinsic anisotropy of the free layer 310 oriented in the y-axis, the MTJ can detect fields in the x-axis direction.

Figure 8:
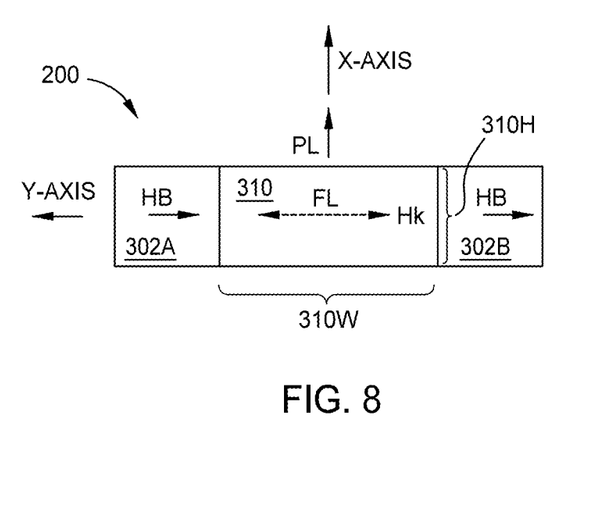
FIG. 8 is a schematic top view illustrating certain embodiments of a single MTJ having intrinsic anisotropy supplemented with shape anisotropy.

FIG. 8 is a schematic top view illustrating certain embodiments of a single MTJ, such as a MTJ 200 along plane A-A of FIG. 3, having intrinsic anisotropy supplemented with shape anisotropy. For ease of description, FIG. 8 includes like numerals as used in FIG. 3. Intrinsic anisotropy can be provided by deposition of the free layer 310 at a high oblique angle. Shape anisotropy is provided by an aspect ratio (width-to-height) of the free layer 310 with a narrow height (310H) in the direction 500 of the magnetic field to be sensed (i.e., the short axis of the MTJ 200 is aligned with the sensing field) and with a large width (310W) in a orthogonal direction to the sensing direction. For example, a free layer 310 formed as a rectangular strip, as shown in FIG. 8, provides shape anisotropy. The free layer 310 with shape anisotropy can be other elongated polygons, such as other elongated trapezoid, other elongated quadrilaterals, elongated ovals, other elongated regular shapes, and other elongated irregular shapes. For an elongated trapezoid, the high width-to-height ratio is calculated by the average of the two widths of the elongated trapezoid with two different widths or calculated by the average of the two heights of the elongated trapezoid with two different heights.

In certain embodiments, the free layer 310 is formed to a width 310W and to a height 310H in a width-to-height ratio of about 4:1 or more, such as from about 7:1 to about 25:1. In certain embodiments, the width 310W of the free layer 310 can be formed from about 1 µm to about 10 µm and the height 310H of the free layer can be formed from about 0.2 µm to about 2 µm. The free layer 310 with a width-to-height ratio of about 4:1 or more has intrinsic and shape anisotropy aligned in a general direction along the width 310W of the free layer 310 of the MTJ 200. The large width 310W helps to control magnetic domain formation to be along the length of the width.

Shape anisotropy of the relatively thick free layer 310 is further provided by the HB element 302A-B at the ends of the strip of the free layer 310. HB element 302A-B formed proximate the ends of the strip of free layer 310 can reduce or prevent undesirable magnetic domain formations in a direction along the height 310H at the ends of the strip of the free layer 310 and can reduce or prevent other non-desirable magnetic domain formations. HB element 302A-B is positioned proximate the edges or ends of the strip of the free layer 310 to stabilize the magnetic moment of the free layer 310. At the edges of the free layer 310, there is a large amount of demagnetizing energy due to the relatively thick free layer 310. The HB element 302A-B can help to provide a free layer 310 to operate with a single magnetic domain by providing continuous magnetization energy at the edge of the free layer 310.

In certain embodiments, the magnetic moment of the HB element 302A-B is set at an angle to the direction of the width 310W of the free layer 310. An angled HB element 302A-B for each of the MTJs of the magnetoresistance legs can be formed by depositing a single hard bias layer with a magnetic moment set an angle before or after patterning to form the HB element 302A-B for each of the MTJs.

Embodiments of the present disclosure generally relate to a large field range TMR sensor of magnetic tunnel junctions (MTJs) with a free layer having high intrinsic anisotropy. The free layer of the MTJ is formed to have high intrinsic anisotropy by deposition as a high oblique angle. The free layer can have high intrinsic anisotropy of about 80 Oe or above. Magnetic domain formations within the free layer can be further controlled by a pinned layer canted at an angle to the intrinsic anisotropy of the free layer, by a hard bias element, by shape anisotropy, or combinations thereof. MTJs with a free layer having high intrinsic anisotropy can form TMR sensors in a Wheatstone configuration having high sensitivity, low hysteresis, and good linearity in response to sensed magnetic fields.

A TMR based magnetic sensor 100 of FIGS. 1-2 comprises at least one of the MTJs having a free layer 310 of FIG. 4, 5A-5B, 6, 7A-B, or 8 with intrinsic anisotropy. For example, the TMR based magnetic sensor can comprise a plurality of MTJs in which one, a minority of, a majority of, or all of the MTJs have a free layer with intrinsic anisotropy.

In one embodiment, the TMR sensor 100 of FIGS. 1-2 comprising at least one of the MTJs having a free layer 310 of FIG. 4, 5A-5B, 6, 7A-B, or 8 with intrinsic anisotropy is used in a camera operating as a single axis sensor. An example of such a sensor is found in United States Patent Application Publication No.: 2019/0020822 A1, which is incorporated herein by reference. However, it is contemplated that the TMR sensor 100 may be utilized as a two dimensional or even a three dimensional sensor. Additionally, it is contemplated that TMR sensor 100 may be integrated and utilized in inertial measurement unit technologies other than cameras such as wearable devices, compasses, and MEMS devices. Furthermore, the TMR sensor 100 may operate as a position sensor, a bridge angular sensor, a magnetic switch, a current sensor, or combinations thereof. The TMR sensor 100 may be used to focus a camera such as a smart phone camera by using the TMR sensors as position and angular sensors. Also, the TMR sensor 100 has applicability in the automotive industry as switch, current, and angular sensors to replace current Hall, anisotropic magnetoresistance (AMR) and giant magnetoresistance (GMR) sensors. TMR sensor 100 can also be used in the drones and robotics industry as position and angular sensors. Medical devices can also utilize the TMR sensor 100 for flow rate control for infusion systems and endoscope camera sensors among others. Thus, the TMR sensor 100 discussed herein has applications well beyond smart phone cameras and thus should not be limited to use as sensors for smart phone cameras. Furthermore, the MTJs of the TMR sensor 100 need not be arranged in a Wheatstone bridge arrangement, but rather, may be arranged in any number of manners.

In one embodiment, a tunnel magnetoresistive (TMR) based magnetic sensor in a Wheatstone configuration includes at least one MTJ. The MTJ includes a free layer having an intrinsic anisotropy produced by deposition at a high oblique angle from normal.

In another embodiment, a TMR based magnetic sensor in a Wheatstone configuration includes at least one MTJ. The MTJ includes a free layer having an intrinsic anisotropy produced by deposition at a high oblique angle from normal. The MTJ includes a pinned layer having a magnetization direction orthogonal to the intrinsic anisotropy of the free layer. The MTJ has a hard bias element positioned proximate the free layer.

In still another embodiment, a TMR based magnetic sensor in a Wheatstone configuration includes at least one MTJ. The MTJ includes a pinned layer. A barrier layer is over the pinned layer. A free layer is over the barrier layer. The free layer has an intrinsic anisotropy from about 200 Oe to about 1600 Oe.

EXAMPLES

The following examples show data of certain embodiments of MTJs and sensors comprising a plurality of MTJs. Such data should not be used to limit the scope of the claims unless explicitly set forth in the claims.

Example 1

Figure 9:
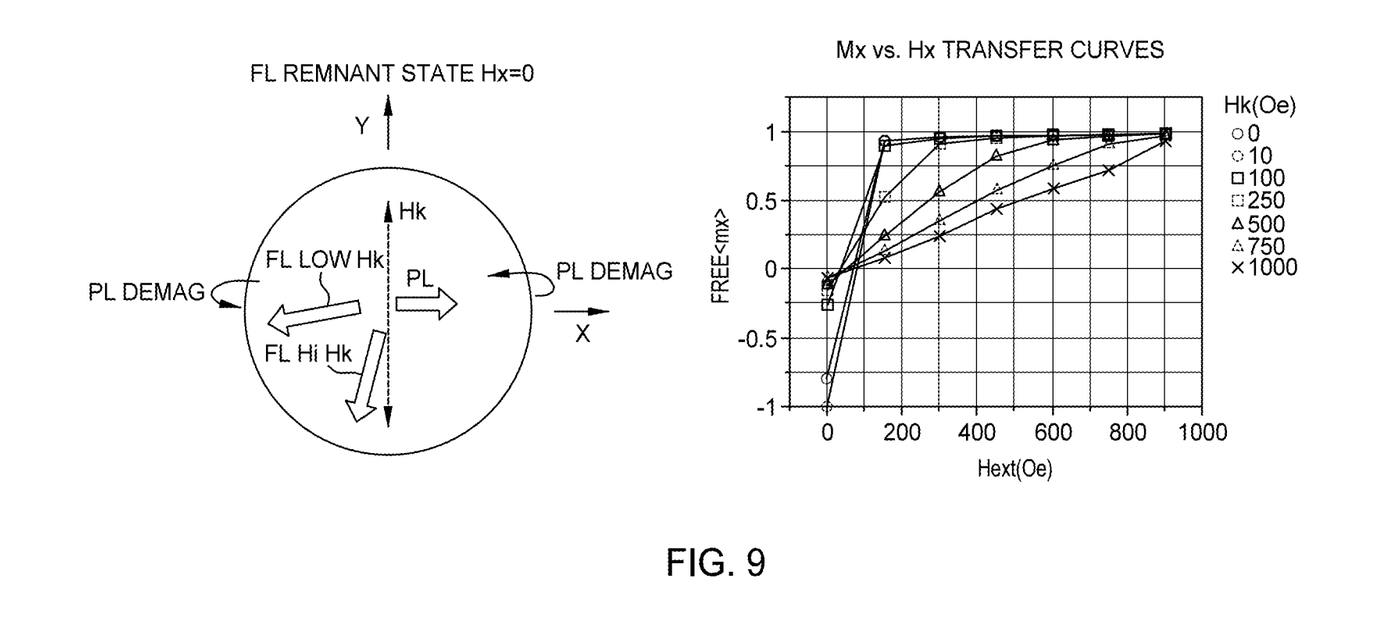
FIG. 9 shows a full micromagnetic simulation of a circular MTJ film stack with various intrinsic anisotropies from 0 to 1,000 Oe.

FIG. 9 shows a full micromagnetic simulation of a circular MTJ film stack having a diameter of 2 um with a 7 nm thick free layer with various intrinsic anisotropies from 0 to 1,000 Oe. The pinned layer is a simple (non-SAF pinned) structure and is 4 nm thick. The MTJ has an easy axis in the transverse direction (y-axis) and is suited to detect magnetic fields in the longitudinal (x-axis) direction. The plot in FIG. 9 shows the transfer curves of the free layer magnetization x-component in response to a field in the x-axis over the various intrinsic anisotropies ($H_k$). As shown in FIG. 9, the linearity of the magnetization curve increases the higher the intrinsic anisotropy.

Example 2

Figure 10:
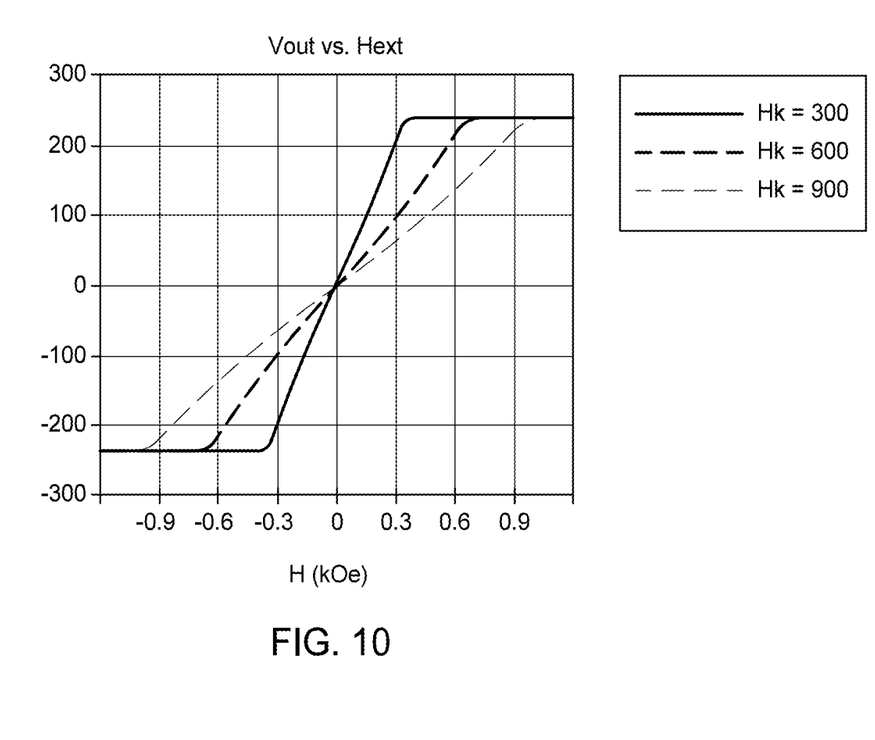
FIG. 10 shows an output of a Wheatstone sensor bridge using MTJs with a free layer with intrinsic anisotropy of 300 Oe, 600 Oe, or 900 Oe using a simplified uniform rotation model.

FIG. 10 shows an output of a Wheatstone sensor bridge using MTJs with a free layer with intrinsic anisotropy of 300 Oe, 600 Oe, or 900 Oe using a simplified uniform rotation model. FIG. 10 shows a high linear response up to the saturation fields equal to the intrinsic anisotropy value.

In contrast, for MTJ using shape anisotropy alone without intrinsic anisotropy, the sensor response becomes nonlinear at fields well below saturation (70-80%), limiting its useful field range, for the same saturation field.

Example 3

Various ferromagnetic materials were deposited at angle from normal deposition. The intrinsic anisotropies (HK) and the corresponding coercivities for the easy axis ($H_{CE}$) were measured and set forth in TABLE 1. In examples A, C, G, H, a single film was deposited to the specified thickness by physical vapor deposition at the specified oblique angle from normal utilizing either CIS PVD tool or a LS PVD tool. In examples B, E, F, a bi-layer film was deposited utilizing two different materials to the specified thicknesses by physical vapor deposition at the specified oblique angles from normal. In example E, NiTa was deposited at a 70° from normal and then $NiFe_{19}$ was deposited at a zero degree from normal (i.e., regular physical vapor deposition with an angle of 0°). In example D, ten layers of 20A thick $NiFe_{19}$ was deposited for a total thickness of 100 Å. The data shows that sensor can be made with a free layer formed of a material deposited at an angle in which the free layer has intrinsic anisotropy with an operating field range of ±1500 Oe.

TABLE 1

| Ex | Tool | Angle | Material | $H_K$ | Hce |
|---|---|---|---|---|---|
| A | CIS | 70° | 110 Å $FeCo_{25}$ | 990 Oe | 420 Oe |
| B | CIS | 60°/70° | 75 Å NiTa/110 Å $FeCo_{25}$ | 1120 Oe | 535 Oe |
| C | CIS | 70° | 53 Å $NiFe_{19}$ | 250 Oe | 50 Oe |
| D | CIS | 70° | (20 Å $NiFe_{19}$) × 10 | 490 Oe | 200 Oe |
| E | CIS | 60°/0° | 395 Å NiTa/50 Å $NiFe_{19}$ | 568 Oe | 67 Oe |
| F | CIS | 70°/70° | 150 Å NiTa/90 Å $NiFe_{19}$ | 800 Oe | 426 Oe |
| G | LS | 73° | 235 Å $FeNi_{27.6}Co_{17.4}$ | ~1500 Oe | ~800 Oe |
| H | LS | 78° | 170 Å $NiFe_{15}Cr_4$ | ~430 Oe | ~150 Oe |

Example 4

Figure 11:
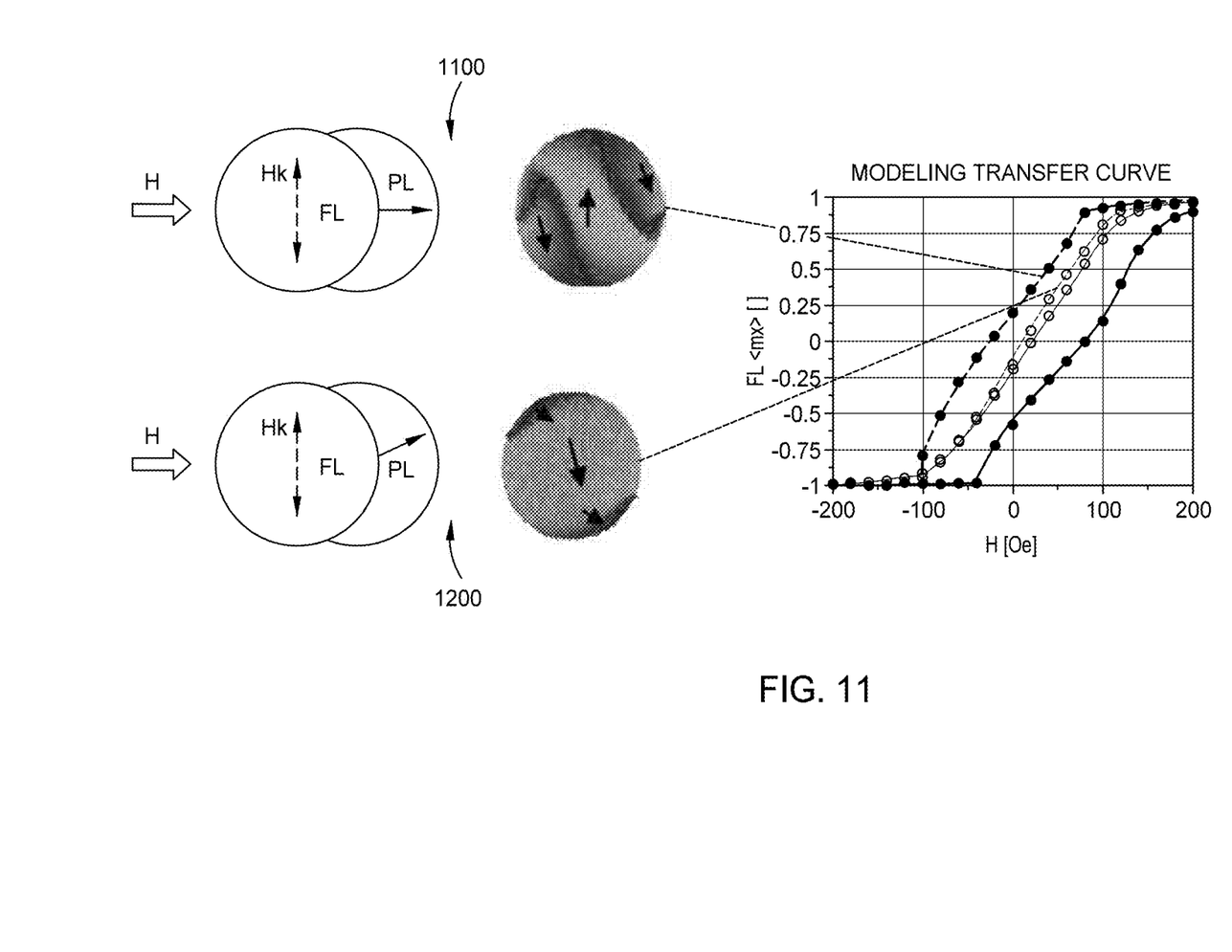
FIG. 11 shows a micromagnetic simulation of MTJs and corresponding transfer curves without any hard bias elements.

FIG. 11 shows a micromagnetic simulation of MTJs and corresponding transfer curves without any hard bias elements. The MTJs are 2 um in diameter. The MTJs include a free layer having a thickness of 7 nm thick with a 100 Oe of intrinsic anisotropy. The comparative MTJ 1100 includes a simple pinned layer (non-SAF) pinned perpendicular to the free layer easy axis. The comparative MTJ 1100 had large hysteresis response and multiple domains formation to a sensed magnetic field. The second MTJ 1200 includes a simple pinned layer (non-SAF) pinned at an angle 45° to the free layer easy axis. The second MTJ 1200 had low hysteresis response and controlled domain formation to a sensed magnetic field due to a small angled bias field on the free layer generated by the pinned layer.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) based magnetic sensor in a Wheatstone configuration, comprising:
at least one magnetic tunnel junction (MTJ), the at least one MTJ comprising:
a free layer deposited at a high oblique angle from normal, the free layer having an intrinsic anisotropy, wherein a magnetization direction of the intrinsic anisotropy is substantially orthogonal to a plane of incidence of deposition at the high oblique angle.

2. The TMR based magnetic sensor of claim 1, wherein the high oblique angle is from 55° to 85°.

3. The TMR based magnetic sensor of claim 1, wherein the free layer comprises a first sub-layer and a second sub-layer.

4. The TMR based magnetic sensor of claim 3, wherein the first sub-layer is formed by static deposition over a substrate in a first position and wherein the second sub-layer is formed by static deposition over the substrate in a second position rotated from the first position.

5. The TMR based magnetic sensor of claim 1, wherein the intrinsic anisotropy is from about 80 Oe to about 1600 Oe.

6. The TMR based magnetic sensor of claim 1, wherein at least one MTJ further comprises a pinned layer with a magnetization direction at an angle from about 40° to 50° from the intrinsic anisotropy of the free layer.

7. The TMR based magnetic sensor of claim 1, wherein the at least one MTJ further comprises:
a pinned layer;
an antiparallel coupling layer; and
an antiferromagnetic pinning layer.

8. A tunnel magnetoresistive (TMR) based magnetic sensor in a Wheatstone configuration, comprising:
at least one magnetic tunnel junction (MTJ), the at least one MTJ comprising:
a free layer deposited at a high angle from normal, the free layer having an intrinsic anisotropy; and
a pinned layer having a magnetization direction orthogonal to the intrinsic anisotropy of the free layer;
wherein the at least one MTJ has a hard bias element positioned proximate the free layer.

9. The TMR based magnetic sensor of claim 8, wherein a magnetic moment of the hard bias element is rotated in reference to the intrinsic anisotropy of the free layer.

10. The TMR based magnetic sensor of claim 9, wherein the hard bias element is formed around the free layer.

11. The TMR based magnetic sensor of claim 9, wherein the hard bias element comprises a first hard bias sub-element and second hard bias sub-element.

12. The TMR based magnetic sensor of claim 8, wherein the free layer further has shape anisotropy, wherein the magnetization direction of the pinned layer is orthogonal to the intrinsic anisotropy and the shape anisotropy of the free layer.

13. The TMR based magnetic sensor of claim 12, wherein the free layer is shaped as an elongated polygon having a width and a height with a width-to-height aspect ratio of about 4:1 or more.

14. A tunnel magnetoresistive (TMR) based magnetic sensor in a Wheatstone configuration, comprising:
at least one of magnetic tunnel junction (MTJ), the at least one MTJ comprising:
a pinned layer;
a barrier layer over the pinned layer; and
a free layer over the barrier layer; the free layer having an intrinsic anisotropy from about 200 Oe to about 1600 Oe, wherein the free layer has micro ridges in a direction of the intrinsic anisotropy.

15. The TMR based magnetic sensor of claim 14, wherein a magnetization direction of the pinned layer is orthogonal to the intrinsic anisotropy of the free layer.

16. The TMR based magnetic sensor of claim 14, wherein a magnetic moment of a hard bias element is rotated in reference to the intrinsic anisotropy of the free layer.

17. The TMR based magnetic sensor of claim 14, wherein the free layer further has shape anisotropy, wherein a magnetization direction of the pinned layer is orthogonal to the intrinsic anisotropy and the shape anisotropy of the free layer.

18. The TMR based magnetic sensor of claim 17, wherein the free layer is shaped as an elongated polygon having a width and a height with a width-to-height aspect ratio of about 4:1 or more.

19. The TMR based magnetic sensor of claim 14, wherein the at least one MTJ further comprises an antiferromagnetic pinning layer disposed on the pinned layer.

20. A tunnel magnetoresistive (TMR) based magnetic sensor in a Wheatstone configuration, comprising:
at least one of magnetic tunnel junction (MTJ), the at least one MTJ comprising:
a pinned layer;
a barrier layer over the pinned layer; and
a free layer over the barrier layer; the free layer having an intrinsic anisotropy from about 200 Oe to about 1600 Oe, wherein the at least one MTJ has a hard bias element positioned proximate the free layer.

* * * * *